US011664432B2

(12) United States Patent
Utess et al.

(10) Patent No.: US 11,664,432 B2
(45) Date of Patent: May 30, 2023

(54) STRESS LAYOUT OPTIMIZATION FOR DEVICE PERFORMANCE

(71) Applicant: GLOBALFOUNDRIES U.S. INC., Santa Clara, CA (US)

(72) Inventors: Dirk Utess, Dresden (DE); Zhixing Zhao, Dresden (DE); Dominik M. Kleimaier, Dresden (DE); Irfan A. Saadat, Santa Clara, CA (US); Florent Ravaux, Wimille (FR)

(73) Assignees: GLOBALFOUNDRIES U.S. INC., Malta, NY (US); KHALIFA UNIVERSITY, Abu Dhabi (AE)

(*) Notice: Subject to any disclaimer, the term of this patent is extended or adjusted under 35 U.S.C. 154(b) by 273 days.

(21) Appl. No.: 16/556,796

(22) Filed: Aug. 30, 2019

(65) Prior Publication Data

US 2021/0066463 A1    Mar. 4, 2021

(51) Int. Cl.
*H01L 27/092* (2006.01)
*H01L 29/417* (2006.01)
*H01L 29/40* (2006.01)
*H01L 29/78* (2006.01)

(52) U.S. Cl.
CPC ...... *H01L 29/41775* (2013.01); *H01L 27/092* (2013.01); *H01L 29/401* (2013.01); *H01L 29/7845* (2013.01)

(58) Field of Classification Search
CPC ............. H01L 27/092; H01L 29/41775; H01L 29/401; H01L 29/7845
See application file for complete search history.

(56) References Cited

U.S. PATENT DOCUMENTS

| 9,018,714 B2* | 4/2015 | Cheng ................. H01L 29/7843 257/412 |
| 9,583,487 B2 | 2/2017 | Giles et al. |
| 9,853,151 B2* | 12/2017 | Rubin ................. H01L 29/7845 |
| 2014/0001561 A1* | 1/2014 | Cheng ............ H01L 21/823814 257/369 |
| 2015/0206972 A1 | 7/2015 | Liu et al. |

OTHER PUBLICATIONS

Auth et al., "45nm High-k + Metal Gate Strain-Enhanced Transistors", (Intel Corp,) CICC18, 2008, 2 pages.
DeSalvo et al., "A mobility enhancement strategy for sub-14nm power-efficient FDSOI technologies", Conference IEEE, Electron Devices Meeting (IEDM), Feb. 23, 2014, 4 pages.

(Continued)

*Primary Examiner* — Dale E Page
*Assistant Examiner* — Wilner Jean Baptiste
(74) *Attorney, Agent, or Firm* — Anthony Canale; Andrew M. Calderon; Calderon Safran & Cole, P.C.

(57) ABSTRACT

The present disclosure relates to semiconductor structures and, more particularly, to a layout optimization for radio frequency (RF) device performance and methods of manufacture. The structure includes: a first active device on a substrate; source and drain diffusion regions adjacent to the first active device; and a first contact in electrical contact with the source and drain diffusion regions and which is spaced away from the first active device to optimize a stress component in a channel region of the first active device.

12 Claims, 4 Drawing Sheets

(56) References Cited

OTHER PUBLICATIONS

Wang et al., "Modeling of Layout-Dependent Stress Effect in CMOS Design", ICCAD'09, Nov. 2-5, 2009, 8 pages.
Cheng et al., "High Performance Extremely Thin SOI (ETSOI) Hybrid CMOS with Si Channel NFET and Strained SiGe Channel PFET", IEEE, 2012, 4 pages.
Lacord et al. "Fast evaluation of Continuous-RX impact on performance for Strained FDSOI", The Japan Society of Applied Physics, 2017, 4 pages.

* cited by examiner

FIG. 4 maximum
compressive stress

FIG. 5

Max compressive for
a PFET device

STRESS LAYOUT OPTIMIZATION FOR DEVICE PERFORMANCE

FIELD OF THE INVENTION

The present disclosure relates to semiconductor structures and, more particularly, to a layout optimization for radio frequency (RF) device performance and methods of manufacture.

BACKGROUND

The scaling of features in Complementary Metal Oxide Semiconductor (CMOS) technologies has become a driving force behind ever-increasing device performance. Scaling to smaller features enables increased densities of functional units on the limited real estate of semiconductor chips. For example, shrinking transistor size allows for the incorporation of an increased number of memory devices on a chip, leading to increased capacity. As scaling continues, the need to optimize performance of each technology node becomes increasingly more difficult to obtain.

Different technology schemes have been devised to optimize device performance as features become ever smaller. For example, some technologies utilize semiconductor-on-insulator (SOI) technology, in which a thin layer of a semiconductor is separated from a semiconductor substrate by a relatively thick electrically insulating layer referred to as a buried oxide (BOX) layer. SOI technology offers certain advantages including allowing CMOS devices to operate at lower power consumption while providing the same performance level.

To improve CMOS device performance even further, stress may be introduced into the channels of the field effect transistors (FETs). When applied in a longitudinal direction (i.e., in the direction of current flow), tensile stress will enhance electron mobility (i.e., n-channel FET drive currents), whereas, compressive stress will enhance hole mobility (i.e., p-channel FET drive currents). Tensile strained SOI is a significant performance driver for NFET transistors, while compressive strained silicon-germanium-on-insulator (SGOI) is a significant performance driver for PFET transistors. Stress is applied by, e.g., the utilization of customized stress liners, which requires complex and costly fabrication processes.

SUMMARY

In an aspect of the disclosure, a structure comprises: a first active device on a substrate; a source and drain diffusion region adjacent to the first active device and having a width "D"; and a first contact in electrical contact with the source and drain diffusion region and which is spaced away from the first active device by a distance "x", wherein x≠D/2 or 0.

In an aspect of the disclosure, a structure comprises: at least a first gate structure; at least a second gate structure, the first gate structure and the second gate structure being different; at least a first contact positioned at a first distance away from the first gate structure; and at least a second contact positioned at a second distance away from the second gate structure. The first contact with the first distance provides a first stress component to a channel region of the first device, and the second contact with the second distance provides a second stress component to a channel region of the second device.

In an aspect of the disclosure, a method comprises: forming a first active device on a substrate; forming source and drain diffusion regions adjacent to the first active device; and forming a first contact in electrical contact with the source and drain diffusion regions and which is spaced away from the first device to optimize a stress component in a channel region of the first active device.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a layout optimization for radio frequency (RF) device performance and methods of manufacture. More specifically, the present disclosure provides cost-effective field effect transistor (FET) performance improvement without the need of a stress liner by use of optimally placed contacts. Advantageously, the present disclosure provides a cost effective and streamlined layout that optimizes device performance.

In embodiments, the layout optimization for radio frequency (RF) device performance includes contact placement for both NFET and PFET structures. That is, the proximity of the contact placement is optimized for device performance. For example, the contact placement is provided as close as possible to the channel for a PFET structure (e.g., asymmetric placement and/or shape of contact for device optimization); whereas, the contact placement is furthest away as possible to the channel for a NFET structure (e.g., asymmetric placement and/or shape of contact for device optimization). In this way, the contact placement for the NFET and PFET structures on a same device are different, i.e., non-matching contact placement. It is also counter-intuitive to place contacts close to the channel due to possible reliability and capacitance issues. In any event, the contact placement for the PFET device will generate a compressive stress in the channel region and contact placement for the NFET device will generate beneficial stress in the channel region, both of which will provide improved device performance.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
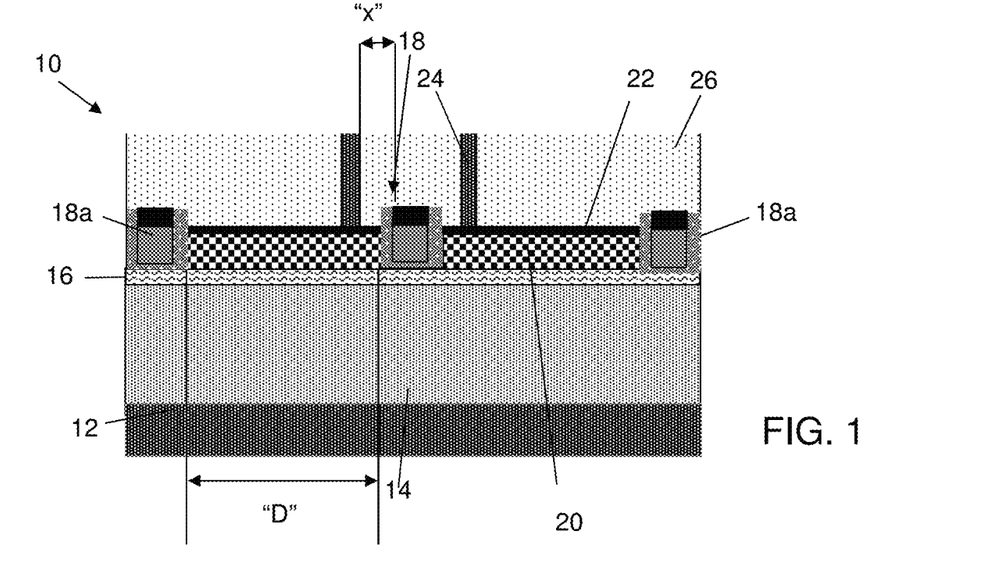
FIG. 1 shows a cross-sectional view of an optimized layout scheme with off-centered contacts for a single finger PFET device and respective fabrication processes in accordance with aspects of the present disclosure.

FIG. 1 shows a cross-sectional view of an optimized layout scheme with off-centered contacts, amongst other features, and respective fabrication processes in accordance with aspects of the present disclosure. More specifically and referring to FIG. 1, the structure 10 is a single finger PFET device which includes a wafer 12 and a substrate 16 on an insulator material 14. In embodiments, the substrate 16 is fully depleted semiconductor on insulator (FDSOI) technology with the insulator layer 14 being a buried oxide layer (BOX), for example. Generally speaking, the substrate 16 can be composed of any suitable material including, but not limited to, Si, SiGe, SiGeC, SiC, GaAs, InAs, InP, and other III/V or II/VI compound semiconductors. For the single finger PFET device, for example, the substrate 16 is preferably SiGe.

Figure 7:
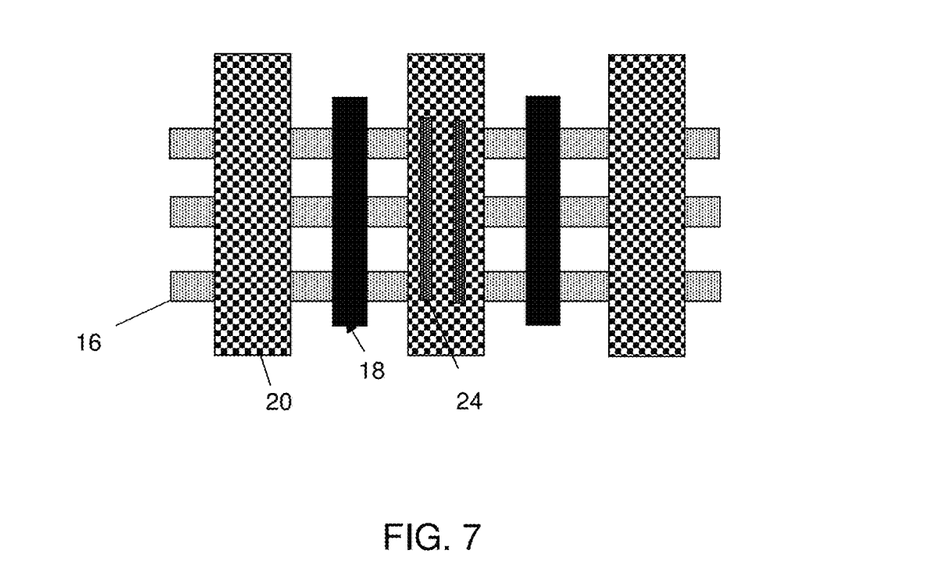
FIG. 7 shows a top view of multiple fin structures, amongst other features, in accordance with aspects of the present disclosure.

In one exemplary non-limiting embodiment, FIG. 1 shows a cross-section of the substrate 16 which can be representative of one fin structure (or multiple fin structures where a finite width in the Z direction inside of the page is replicated). A top view of multiple fin structures 16 is also shown in FIG. 7 described below. The fin structures 16 can be formed using conventional sidewall image transfer (SIT) techniques.

In the SIT technique, for example, a mandrel material, e.g., $SiO_2$, is deposited on the substrate 16, using conventional CVD processes. A resist is formed on the mandrel material, and exposed to light to form a pattern (openings). A reactive ion etching (RIE) is performed through the openings to form the mandrels. In embodiments, the mandrels can have different widths and/or spacing depending on the desired dimensions between narrow fin structures and/or wide fin structures. Spacers are formed on the sidewalls of the mandrels which are preferably material that is different than the mandrels, and which are formed using conventional deposition processes known to those of skill in the art. The spacers can have a width which matches the dimensions of the fin structures 16, for example. The mandrels are removed or stripped using a conventional etching process, selective to the mandrel material. An etching is then performed within the spacing of the spacers to form the sub-lithographic features. The sidewall spacers can then be stripped. In embodiments, the fin structures can also be formed during this or other patterning processes, or through other conventional patterning processes, as contemplated by the present disclosure.

Still referring to FIG. 1, active gate structures 18 (PFET devices) and dummy gate structures 18a (e.g., dummy PC line) are formed over the substrate (e.g., fins) 16 by any known gate fabrication process, i.e., gate first process or replacement gate process. In embodiments, the gate structures 18, 18a can be composed of a gate-dielectric material (e.g., high-k dielectric material), workfunction metals and sidewall spacers (e.g., oxide or nitride).

In the gate first process, for example, the gate dielectric and workfunction metals (or poly) can be deposited using any conventional deposition methods, e.g., chemical vapor deposition (CVD), plasma enhanced CVD (PECVD), etc. Following the deposition of the materials, the materials can be subjected to a patterning process using conventional lithography and etching (RIE) processes. For the sidewall spacers, after deposition of the material over the patterned gate structures, an anisotropic etching process can be utilized to remove the sidewall spacer material from the substrate 16 and top of the gate structures 18, 18a. By using spacers, the device performance can be improved. Also, it should be understood by those of ordinary skill in the art that multiple spacer processes can be utilized for optimizing the field under the gate structure. In the gate last process, for example, after several processing steps, dummy gate material between sidewalls can be removed and replaced with gate material(s).

Still referring to FIG. 1, source and drain diffusion regions 20 are formed on the substrate 16 for each of the gate structures 18. The source and drain diffusion regions 20 have a width "D" and can be formed by conventional ion implantation processes known by those of ordinary skill in the art such that no further explanation is required for a complete understanding of the present disclosure. In more specific embodiments, the source and drain diffusion regions 20 can be raised source and drain regions formed by a doped epitaxial growth process as is known by those of ordinary skill in the art such that no further explanation is required for a complete understanding of the present disclosure. As should be understood by those of skill in the art and as described herein, the diffusion regions 20 can be between active gate structures or an active gate structure and a dummy gate structure.

Contacts 24 are formed in electrical and direct contact with silicide 22 formed over the source and drain diffusion regions 20. As should be understood by those of skill in the art, the silicide process begins with deposition of a thin transition metal layer, e.g., nickel, cobalt or titanium, over fully formed and patterned semiconductor devices (e.g., doped or ion implanted source and drain diffusion regions 20 and respective devices 18, 18a). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide 22 in the active regions of the device.

In embodiments, the contacts 24 are formed in dielectric material 26 using conventional lithography, etching and deposition processes. For example, following the deposition of the dielectric material 26, trenches are formed in the dielectric material 26 to expose the source and drain diffusion regions 20 (with their associated silicide 22). The trenches are formed by conventional lithography and etching (RIE) processes. Metal material, e.g., tungsten, cobalt, etc., is then deposited within the trenches, followed by a planarization process such as a chemical mechanical polishing (CMP), to form the contacts 24.

As shown in FIG. 1, the contacts 24 are off-centered between the gate structures 18, 18a. In more specific embodiments, for a single finger PFET device, the contacts 24 are at an optimal proximity location, i.e., off centered, close to the channel of the gate structure 18, without breaking design rules, i.e., so as to not result in a shorting or leakage between the gate structures 18 and the source and drain diffusions 20. Preferably, the contacts 24 are provided close to the channel with optimal distance to the gate structures 18 without breaking the design rules, e.g., with a spacing "x" of a minimal design rule. In embodiments, for example, the distance "x" is in the range of about 20 nm to 40 nm; although other dimensions are also contemplated herein depending on the technology node and desired performance characteristics. In embodiments, the contact 24 is not placed in the middle of the S/D region 20, i.e., $x \neq D/2$, and, more preferably, the contact 24 is placed less than half the width "D" and greater than 0 ($x<D/2>0$) of the diffusion region 20. In other words, the contact 24 is provided closer to the active gate structures 18.

It should be understood that with all of the embodiments described herein, an optimum distance depends on technology node and layout. For example, the width "D" of the diffusion region will scale depending on gate pitch (CPP), contact size, channel thickness (SOI), contact material, and other physical parameters linking to each technology node such as, e.g., raised S/D.

Although counter-intuitive, it has been found that the placement of the contacts 24 will increase PFET device performance by providing a beneficial compressive stress underneath the gate structures 18 (e.g., under the sidewalls of the gate structure). Also, by using the contacts 24 to provide a stress, i.e., compressive stress, it may now be possible to eliminate a stress liner.

Figure 2:
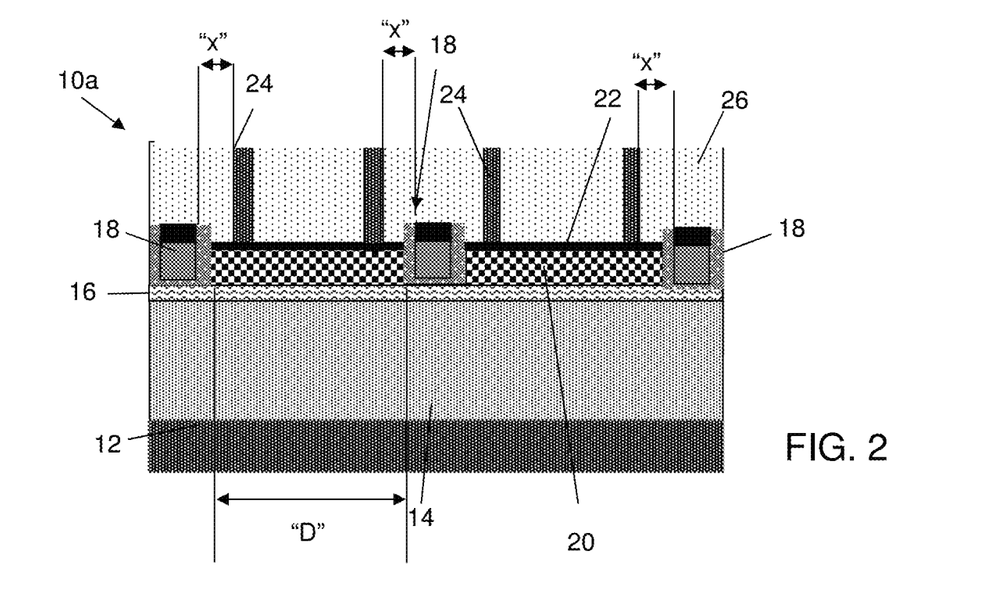
FIG. 2 shows a cross-sectional view of an optimized layout scheme with off-centered contacts for a multi-finger PFET device and respective fabrication processes in accordance with aspects of the present disclosure.

FIG. 2 shows a cross-sectional view of an optimized layout scheme with off-centered contacts for a multi-finger PFET device and respective fabrication processes. More specifically, in FIG. 2, the structure 10a includes a plurality of active gate structures 18 for a multi-finger PFET device. In this embodiment, the contacts 24 are off-centered and, more specifically, placed closer to each of the gate structures 18 (e.g., PFET devices). Preferably, the contacts 24 are at an optimal proximity location, i.e., off centered and close to the active gate structures 18, e.g., with a spacing "x" of a minimal design rule. In embodiments, for example, the distance "x" is in the range of about 20 nm to about 40 nm; although other dimensions are also contemplated herein depending on the technology node and desired performance characteristics. More specifically, and as described above, the contact 24 is not placed in the middle of the S/D region 20, D/2, and, more preferably, the contact 24 is placed at less than half the width "D" and greater than 0 ($x<D/2>0$) of the diffusion region 20, i.e., closer to the active gate structures 18. As described above, the placement of the contacts 24 will provide a beneficial compressive stress under the active gate structures 18, hence increasing PFET device performance. Also, the contacts 24 may eliminate the need for a stress liner.

Figure 3:
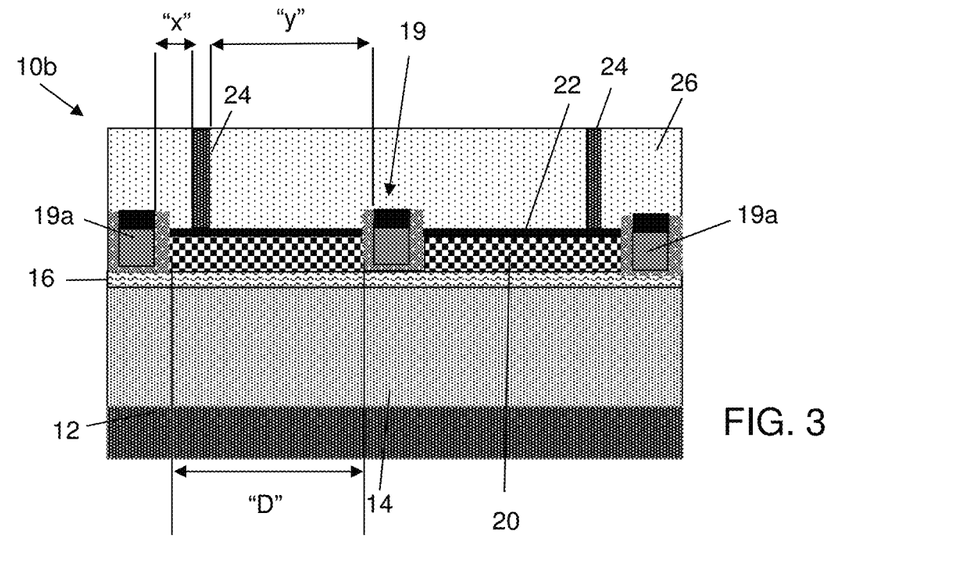
FIG. 3 shows a cross-sectional view of an optimized layout scheme with off-centered contacts for a single finger NFET device and respective fabrication processes in accordance with additional aspects of the present disclosure.

FIG. 3 shows a cross-sectional view of an optimized layout scheme with off-centered contacts, amongst other features, for a NFET device. More specifically, the structure 10b of FIG. 3 is a single finger NFET device which includes a wafer 12, substrate 16 and an insulator material 14 in FDSOI technology, with the insulator material 14 being a BOX. Generally speaking, the substrate 16 can be composed of any suitable material including, but not limited to, Si, SiGe, SiGeC, SiC, GaAs, InAs, InP, and other III/V or II/VI compound semiconductors. For a single finger NFET device, the substrate 16 is preferably Si.

Still referring to FIG. 3, active gate structures 19 (e.g., NFET devices) and dummy gate structures 19a (e.g., dummy PC line) are formed over the substrate (e.g., fins) 16. In embodiments, the gate structures 19 are finFETs formed by any known gate fabrication process, i.e., gate first process or replacement gate process. As previously noted, the gate structures 19, 19a can be composed of a gate-dielectric material (e.g., high-k dielectric material), workfunction metals (for NFET devices) and sidewall spacers (e.g., oxide or nitride) using similar processes described with respect to FIG. 1, for example. Source and drain diffusion regions 20 are formed on the substrate 16 for each of the gate structures 19. The source and drain diffusion regions 20 can be formed by conventional ion implantation processes and, in more specific embodiments, by a doped epitaxial growth process as is known by those of ordinary skill in the art.

The contacts 24 formed in the dielectric material 26 are in electrical and direct contact with silicide contacts 22 of the source and drain diffusion regions 20. As shown in FIG. 3, the contacts 24 are off-centered and, more specifically, for a single finger NFET device, the contacts 24 are preferably a maximum distance away from the channel of the active gate structures 19, e.g., beyond a center point between adjacent gate structures 19, 19a. More specifically, the spacing "y" of the contacts 24 is greater than half the width "D" ($y>D/2$) of the diffusion region 20. In other words, the contact 24 is provided farther away from the active gate structures 18.

To have the contacts maximally positioned from the gate structures 19 requires the contacts 24 to be provided closer to the dummy gate structures 19a, e.g., preferably with a spacing "x" of a minimal design rule, thereby resulting in a maximum possible distance "y" away from the active gate structures 19. In embodiments, for example, the distance "x" is in the range of about 20 nm to about 40 nm; although other dimensions are also contemplated herein depending on the technology node and desired performance characteristics. In other embodiments, the distances can be based on modeling and characterization data as should be now understood by those of skill in the art. In embodiments, the placement of the contacts 24 will provide a beneficial stress adjacent to and/or under the active gate structures 19, hence increasing device performance. Also, the optimized placement of the contacts 24 may eliminate the need for a stress liner.

Figure 4:
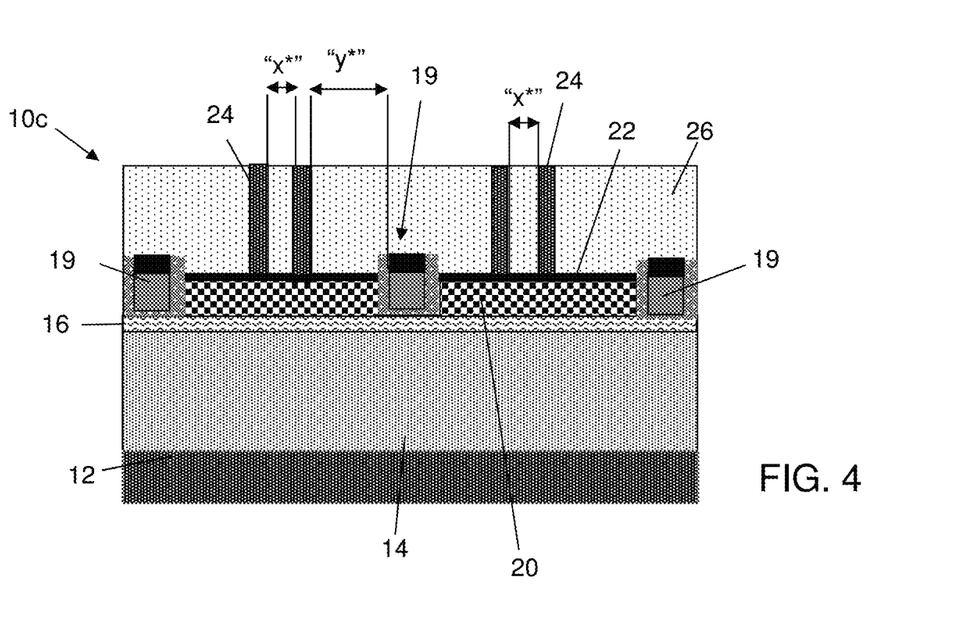
FIG. 4 shows a cross-sectional view of an optimized layout scheme with off-centered contacts for a multi-finger NFET device, amongst other features, and respective fabrication processes in accordance with additional aspects of the present disclosure.

FIG. 4 shows a cross-sectional view of an optimized layout scheme with off-centered contacts for a multi-finger NFET device and respective fabrication processes. More specifically, in FIG. 4, the structure 10c includes a plurality of active gate structures 19 for a multi-finger NFET device. In this embodiment, the contacts 24 are off-centered and, more specifically, placed as far as possible (e.g., maximally) from the channel of each of the active gate structures 19.

Preferably, the contacts 24 are provided as close to the center point (midpoint) between the gate structures 19, e.g., with a spacing "x*" of a minimal design rule between the contacts 24. That is, the contacts 24 are placed centrally between the respective active devices 19 such that both contacts 24 are maximally spaced away from their respective active devices. Accordingly, the distance "y*" will be maximized, e.g., a maximum distance away from their respective active gate structures 19 of the multi-finger NFET devices. As described above, the placement of the contacts 24 will provide a beneficial stress (e.g., reduce the compressive stress of the contact) under the gate structures 19, hence increasing device performance and eliminating the need for a stress liner.

It should be understood by those of ordinary skill in the art that any combination of the single finger and multi-finger NFET and PFET structures shown in FIGS. 1-4 can be combined into a single device. For example, it is contemplated herein that a single finger PFET device and single finger NFET device of FIGS. 1 and 3 can be combined into a single device. Similarly, the multi-finger PFET device and multi-finger NFET device of FIGS. 2 and 4 can be combined into a single device. Also, any combination of the single and multi-finger PFET and NFET devices can be combined into a single device.

Figure 5:
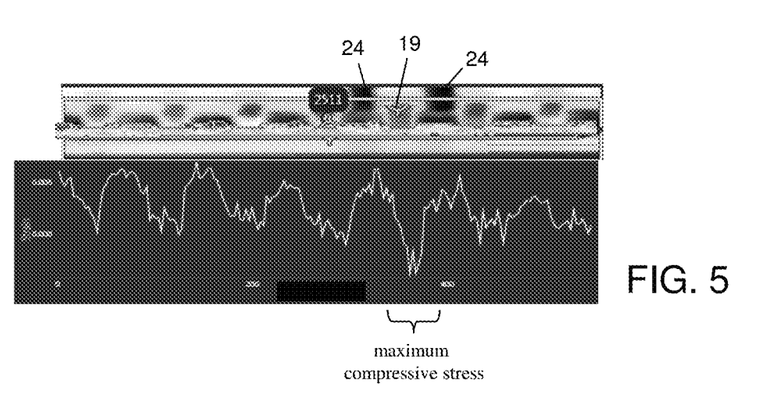
FIG. 5 shows the influence of contacts on strain measurements on a channel of a device.

FIG. 5 shows the influence of contacts on strain measurements on a channel of a device. In particular, FIG. 5 shows an increase in stress on the channel of the device, e.g., gate structure, imposed by contact placement. More specifically, FIG. 5 shows a maximum compressive stress on the channel of a PFET device 19, imposed by the contacts 24.

Figure 6:
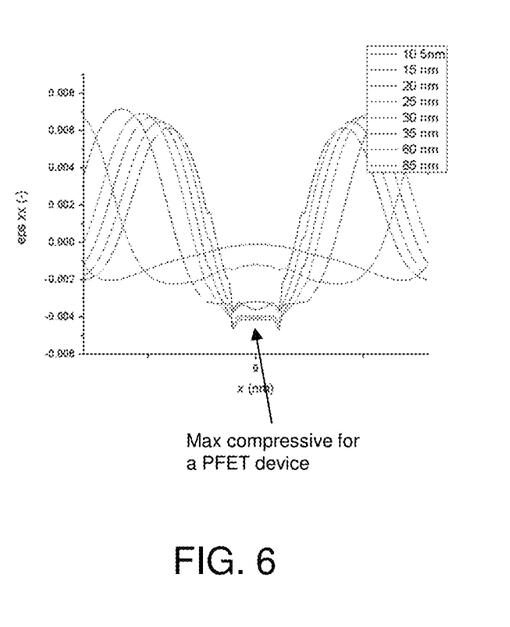
FIG. 6 shows simulation data of an optimal distance between the contact and gate structure by induced strain in the channel.

FIG. 6 shows simulation data of an optimal distance between the contact and gate structure by induced strain in the channel. The graph of FIG. 6 includes a y-axis representative of strain placed on a channel and the x-axis is representative of the coordinate in the channel direction (in nm). The graph also shows several simulations: 10.5 nm to 85 nm distance of contact from the gate structure. As shown in the graph, a distance of 20 nm provides the maximum compressive stress for a PFET device, evidencing that placement of the contact close, in optimal proximity to the channel region, will result in the increase of compressive stress placed in the channel region of the gate structure for a PFET device.

FIG. 7 shows a top view of multiple fin structures 16, amongst other features, in accordance with aspects of the present disclosure. More specifically, FIG. 7 shows three fin structures 16, although multiple additional fin structures are contemplated herein. In embodiments, the fin structures 16 are fabricated from substrate material as described with respect to FIG. 1. A plurality of gate structures (e.g., PFET structures) 18 (18a) are formed over the fin structures 16. In embodiments, the gate structures 18 are active gate structures. Source and drain diffusion regions 20 are formed adjacent to the gate structures 18. The source and drain diffusion regions 20 can be formed by ion implantation or doping processes as already described herein. Contacts 24 are formed on the source and drain diffusion regions 20. As should now be understood by those of skill in the art in view of the above disclosure, the contacts 24 can be asymmetrically placed for device optimization.

Figure 8A:
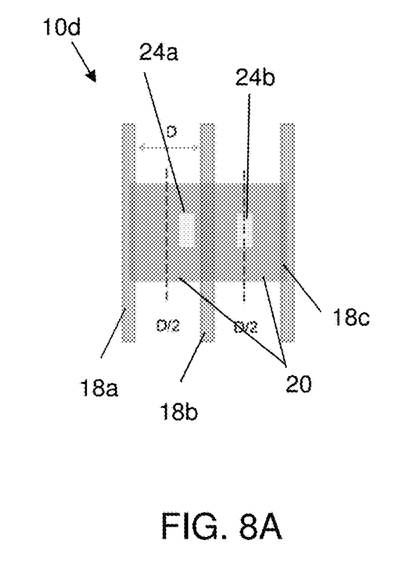
FIGS. 8A and 8B show a top view of different multiple fin structures, amongst other features, in accordance with additional aspects of the present disclosure.
Figure 8B:
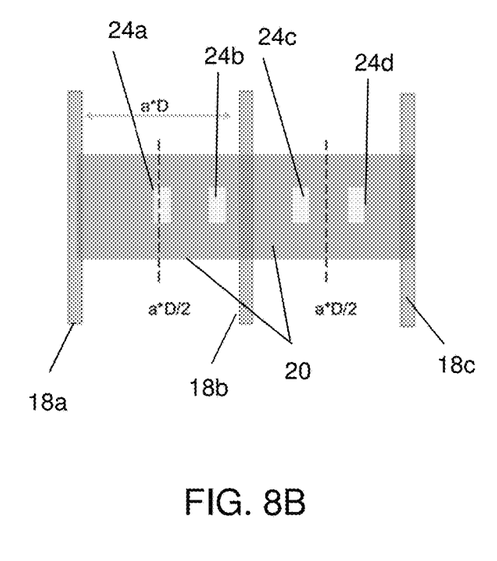

FIGS. 8A and 8B show a top view of a different multiple fin structures in accordance with additional aspects of the present disclosure. More specifically, FIG. 8A shows a multi-finger device 10d comprising multiple active gate structures 18a-18c, e.g., PFETs, with at least one offset contact. More specifically, in FIG. 8A, contact 24a between two adjacent gate structures 18a-18b is closer to the gate structures 18b (compared to gate structure 18a); whereas, the contact 24b is centered between two adjacent gate structures 18b and 18c. It should be understood that in a NFET configuration, the contact 24a can be placed maximally away from the active gate structure 18b.

In FIG. 8B, the multi-finger device 10e again comprises multiple active gate structures 18a-18c, e.g., PFETs. In the structure 10e, though, two contacts are provided between each of the pairs of active gate structures 18a-18b and 18b-18c. As shown, for example, contact 24a between the two adjacent gate structures 18a-18b is centered and contact 24b is provided closer to the gate structures 18b (compared to gate structure 18a); whereas, the contacts 24c, 24d are evenly spaced from the center (D/2) closer to both respective gate structures 18b and 18c.

The method(s) as described above is (are) used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a first active device on a substrate;
   a source and drain diffusion region adjacent to the first active device and having a width "D"; and
   a first contact in electrical contact with the source and drain diffusion region and which provides a stress component of the first active device by being spaced away from the first active device by a distance "x", wherein x≠D/2 or 0.

2. The structure of claim 1, wherein the first active device is a PFET device and the x<D/2>0.

3. The structure of claim 2, wherein the distance "x" is greater than a minimum design rule distance defined for the PFET device, the first contact is off centered and closer to the PFET device than an NFET device or a dummy gate structure.

4. The structure of claim 2, further comprising a dummy gate structure positioned away from the PFET device, wherein the first contact is placed closer to the PFET device than the dummy gate structure.

5. The structure of claim 1, further comprising at least a second active device and at least a second contact, wherein the first active device and the second active device are PFET devices of a multi-fingered device.

6. The structure of claim 5, wherein the second contact is placed closer to the second active device than the first active device and the first contact is placed closer to the first active device than the second active device, both of which are off centered from a midpoint between the first active device and the second active device and which are provided in an asymmetric contact placement.

7. The structure of claim 1, wherein the first active device is a NFET device and the distance "x" is greater than D/2 such that the first contact is off centered and is further away from the NFET device than a dummy gate structure.

8. The structure of claim 1, further comprising a dummy gate structure, wherein
the first active device is a single finger NFET device, and
the first contact is placed closer to the dummy gate structure than to the first active device.

9. The structure of claim 8, wherein the first contact is placed within a minimum design rule distance away from the dummy gate structure to be maximally spaced away from the single finger NFET device.

10. The structure of claim 1, further comprising at least a second active device and at least a second contact, wherein the first active device and the second active device are type of devices, and the first contact is placed centrally between the active devices and the second contact is maximally spaced away from the first active device.

11. The structure of claim 1, further comprising at least a second active device and at least a second contact, wherein:
the first active device and the second active device are NFET devices of a multi-fingered device, and
the first contact and the second contact are placed centrally between the NFET devices such that both the first contact and the second contact are maximally spaced away from the first active device and the second active device, respectively.

12. The structure of claim 1, further comprising at least a second active device and at least a second contact, wherein the first active device is a PFET device, the second active device is a NFET device, and the first contact and the second contact have unmatched spacing from the first active device and the second active device.

\* \* \* \* \*